(12) United States Patent
Jing

(10) Patent No.: US 9,500,698 B2
(45) Date of Patent: Nov. 22, 2016

(54) HIGH AND LOW TEMPERATURE TEST EQUIPMENT

(71) Applicants: BOE TECHNOLOGY GROUP CO., LTD., Beijing (CN); HEFEI BOE OPTOELECTRONICS TECHNOLOGY CO., LTD., Hefei (CN)

(72) Inventor: Yangkun Jing, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 432 days.

(21) Appl. No.: 14/093,369

(22) Filed: Nov. 29, 2013

(65) Prior Publication Data

US 2014/0153609 A1 Jun. 5, 2014

(30) Foreign Application Priority Data

Nov. 30, 2012 (CN) .......................... 2012 2 0652414

(51) Int. Cl.

| | |
|---|---|
| *G01K 1/00* | (2006.01) |
| *G01K 7/00* | (2006.01) |
| *G01R 31/28* | (2006.01) |
| *G02F 1/13* | (2006.01) |
| *G09G 3/00* | (2006.01) |
| *G09G 3/36* | (2006.01) |

(52) U.S. Cl.
CPC ......... *G01R 31/2817* (2013.01); *G02F 1/1309* (2013.01); *G09G 3/006* (2013.01); *G09G 3/36* (2013.01); *G09G 2320/041* (2013.01)

(58) Field of Classification Search
USPC .......................... 374/208, 57, 166, 141, 179
See application file for complete search history.

(56) References Cited

U.S. PATENT DOCUMENTS

| | | | |
|---|---|---|---|
| 7,954,993 B2 * | 6/2011 | Hewinson | G01J 1/4257 136/203 |
| 2015/0003494 A1 * | 1/2015 | Yokoyama | G01N 1/44 374/55 |

* cited by examiner

*Primary Examiner* — Mirellys Jagan
(74) *Attorney, Agent, or Firm* — Blakely, Sokoloff, Taylor & Zafman LLP

(57) ABSTRACT

The invention relates to the technical field of LCD fabrication and specifically to a high and low temperature test equipment. The high and low temperature test equipment comprises a housing, and further comprises a partition disposed in the interior of the housing. The partition divides the interior of the housing into a plurality of chambers and is provided with a Peltier effect sheet. The Peltier effect sheet is used for, when it is powered-on, cooling at least one of the chambers and meanwhile heating at least one chamber other than the at least one of the chambers. The high and low temperature test equipment may cool and heat at the same time in an efficient, power conserving way and have uniform heating function.

20 Claims, 4 Drawing Sheets

HIGH AND LOW TEMPERATURE TEST EQUIPMENT

FIELD OF THE INVENTION

The present invention relates to LCD fabrication technologies, more particularly, to a high and low temperature test equipment.

BACKGROUND OF THE INVENTION

A substance may exhibit different temperature characteristics and have different properties at different temperatures. In this sense, to ensure qualified performance of a substance or a product using the substance under different ambient temperatures, a high and low temperature test will be performed on the finished product to ensure the product quality.

A liquid crystal panel is a critical component of a liquid crystal display (LCD). Liquid crystals are filled in the liquid crystal panel, and the property of the liquid crystals plays an important role in determining the performance of the liquid crystal panel. Currently, the high and low temperature test on the liquid crystal panel is generally conducted by placing the liquid crystal panel in a high temperature chamber and a low temperature chamber respectively, and detecting the stability of the performance of the liquid crystal panel by simulating an environment with high, low or alternate temperature. Conventional high and low temperature test equipments for the liquid crystal panel have the following drawbacks:

1. The high and low temperature test equipments are separated, which results in that the heat generated by the low temperature test equipment during cooling is dissipated, while the heating efficiency and heat uniformity of the high temperature test equipment are low. Moreover, the liquid crystal panel has to be moved or shifted to conduct the tests.

2. The high and low temperature test equipments are bulky and occupying a huge space in the clean room, which increases the production cost.

3. Both the noise generated by the high and low temperature test equipments and the cooling agent used in the low temperature test equipment negatively impact the environment

SUMMARY OF THE INVENTION

In view of the above disadvantages in the conventional art, an object of the Invention is to provide a high and low temperature test equipment which is efficient and energy conserving and can ensure a better heat uniformity in the heating chamber.

An aspect of the invention provides a high and low temperature test equipment comprising a housing and a partition disposed in the Interior of the housing. The partition divides the interior of the housing into a plurality of chambers and is provided with a Peltier effect sheet. The Peltier effect sheet is used for, when it is powered-on, cooling at least one of the chambers and meanwhile heating at least one chamber other than the at least one of the chambers.

Preferably, an air convection unit is disposed in each of the chambers.

Preferably, an air convection unit is disposed in chamber being heated.

Preferably, the air convection unit comprises an inlet, an outlet and a heat diffusing mechanism, wherein the inlet is used for accessing of external air into the chamber, the outlet is used for air exhausting from the chamber, and the heat diffusing mechanism is used for diffusing and circulating heat in the chamber through the air.

Preferably, the Inlet and the outlet are respectively disposed on a wall of the chamber, and the heat diffusing mechanism comprises a diffusion plate and a fan, wherein the diffusion plate is disposed on a side of the partition and the vent direction of the fan is towards the diffusion plate.

Preferably, a grating plate parallel to and separated from the partition is further disposed in the chamber being heated, and the fan is disposed on a side of the grating plate that faces the partition; and the inlet is disposed on a chamber wall next to the partition and is positioned between the grating plate in the chamber being heated and the partition, and the outlet is disposed on a chamber wall opposite to the grating plate;

or, both the inlet and the outlet are disposed on the partition and connected to a pipe leading to the exterior of the housing, with one outlet being disposed between two inlets.

More preferably, a filter grid is disposed in the chamber being heated and is adjacent to the grating plate.

Preferably, the equipment further comprises a control unit and a temperature acquiring unit, the temperature acquiring unit comprises a first temperature acquiring unit and a second temperature acquiring unit, the Peltier effect sheet is serially connected to a variable resistor, and the control unit is electrically connected to the first temperature acquiring unit, the second temperature acquiring unit and the variable resistor respectively, wherein, the first temperature acquiring unit is disposed in at least one chamber and adapted for acquiring a first temperature value in the chamber in real time, and outputting the acquired first temperature value to the control unit;

the second temperature acquiring unit is disposed on the Peltier effect sheet and adapted for acquiring a second temperature value of one end of the Peltier effect sheet which is in the chamber in real time, and outputting the acquired second temperature value to the control unit;

the control unit determines whether the first temperature value is equal to a preset temperature value of the chamber and adjusts a resistance of the variable resistor according to the determination result to control a current so as to control the second temperature value.

Preferably, the control unit comprises a determining sub module for determining whether the first temperature value is equal to a preset temperature value of the chamber and a processing sub module for adjusting a resistance of the variable resistor according to the determination result to control a current so as to control the second temperature value.

Preferably, at least a part of the grating plate consists of sub grating plates arranged in an intersecting manner vertically and horizontally; the sub grating plate is provided with an opening control valve for adjusting the opening of the sub grating plate; the inlet is provided with an inlet valve and the outlet is provided with an outlet valve.

Preferably, the chambers are cooled or heated based on a current flow direction in the Peltier effect sheet.

Preferably, a plurality of notches for holding plate-like components are disposed in the chambers.

NUMERAL REFERENCES

1 N-type element; 2 P-type element; 3 first metal conductor; 4 DC power source; 5 second metal conductor; 6 insulating plate; 7 isolating layer; 8 partition; 9 cooling chamber; 10 heating chamber; 11 Peltier effect sheet; 111 cooling side; 112 heating side; 12 fan; 13 inlet; 14 outlet; 15 diffusion plate; 16 filter grid; 17 grating plate; 18 notch; 19 liquid crystal panel.

DETAILED DESCRIPTION OF THE EMBODIMENTS

To make the technical solution understandable to those skilled in the art, the high and low temperature test equipment of the invention will be described in detail in connection with the drawings and embodiments in the following. Please note that the drawings are for illustrative purpose only, in which sizes and relative positions of individual components do not exactly reflect the practical situations.

Thermoelectric cooling (TEC) is established according to the principle of the Peltier effect. The principle of TEC is: when a P-N junction formed by semiconductor materials forms a thermocouple, current is generated when charge carriers move in the thermocouple. The charge carriers are in different energy level for different materials, as a result, when the charge carriers move from a higher energy level to a lower energy level, redundant heat is released (behaving as heating); while in the reverse procedure, heat is absorbed from the environment (behaving as cooling). Therefore, according to the Peltier effect, when two different semiconductors form a circuit and a DC current is supplied to the circuit, besides the Joule heat, some other heat will be released or absorbed at a contact between the two semiconductors, thereby achieving a heating or cooling effect. The Peltier effect sheet is fabricated in this way accordingly.

The invention provides a high and low temperature test equipment according to the principle of the Peltier effect. The equipment comprises a housing and a partition disposed in the interior of the housing. The partition divides the interior of the housing into a plurality of chambers and is provided with a Peltier effect sheet. The Peltier effect sheet is used for, when it is powered-on, cooling at least one of the chambers and meanwhile heating at least one chamber other than the at least one of the chambers. In the following, for the convenience of description, the chamber being cooled is referred to as a first chamber or a cooling chamber and the chamber being heated is referred to as a second chamber or a heating chamber. Please understand that terms 'first', 'second' and so on are used for discriminating one/one set of component(s) or portion(s) from another/another set of component(s) or potion(s) and not for limiting the invention. In other words, a component referred to as "a first component" may also be referred to as 'a second component', and vice versa.

Embodiment 1

Figure 1:
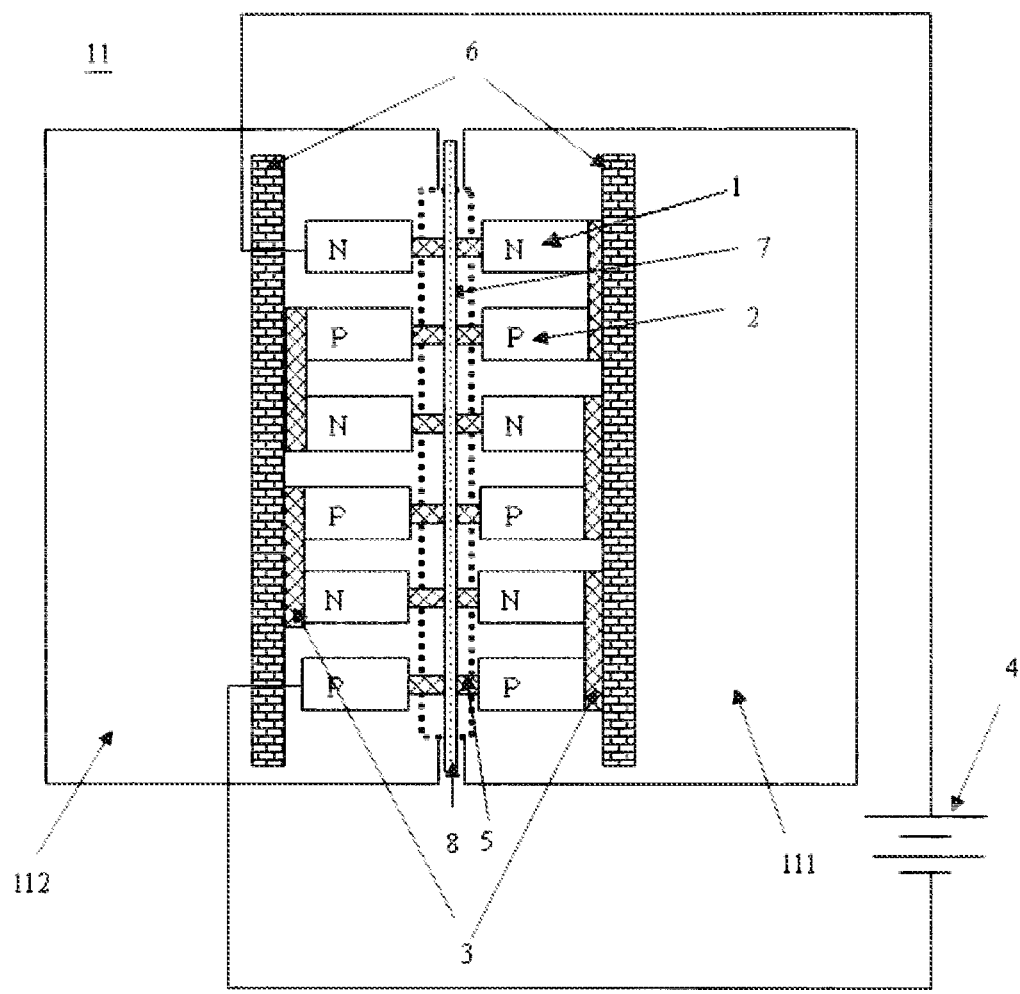
FIG. 1 is a schematic configuration of a Peltier effect sheet in accordance with Embodiment 1 of the present invention.
Figure 2:
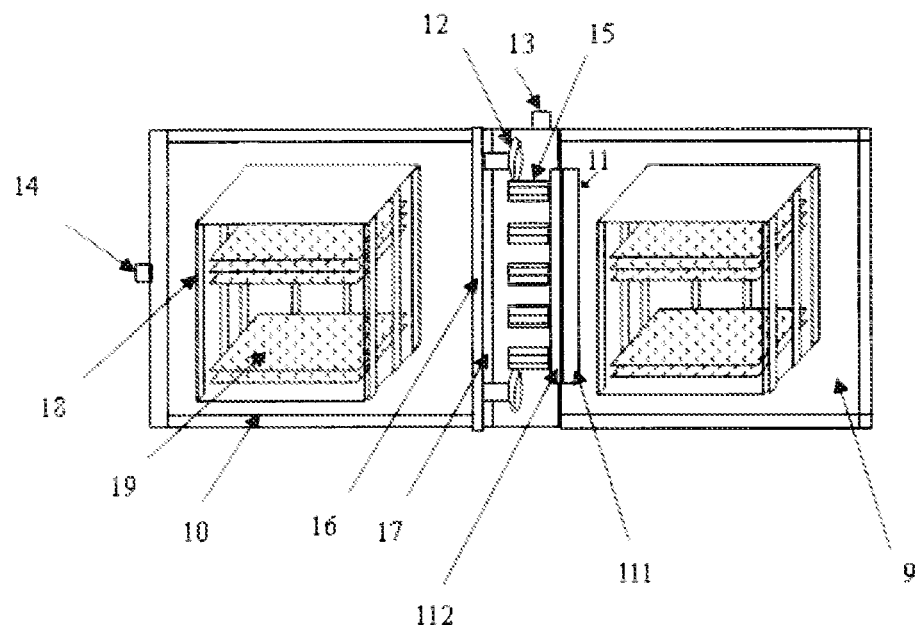
FIG. 2 is a schematic configuration of a high and low temperature test equipment in accordance with the Embodiment 1 of the present invention.

In the following, the invention will be described in connection with the drawings and with reference to an example of the embodiment 1, wherein the housing is divided by the partition into a first chamber and a second chamber separated from each other. In the embodiment, the first chamber is a cooling chamber 9, the second chamber is a heating chamber 10, and a Peltier effect sheet 11 is disposed on a partition 8. As illustrated in FIGS. 1 and 2, the Peltier effect sheet 11 is disposed between the cooling chamber 9 and the heating chamber 10. The Peltier effect sheet 11 has a cooling side 111 and a heating side 112, where the cooling side 111 is disposed in the cooling chamber 9 and adapted for providing cooling capacity to the cooling chamber 9, while the heating side 112 is disposed in the heating chamber 10 and adapted for providing heating capacity to the heating chamber 10. The Peltier effect sheet 11 may be monolithically disposed on the partition 8 or be divided into a plurality of separate parts and disposed on the partition 8 as needed. When the Peltier effect sheet 11 is monolithically disposed on the partition 8 and has the same size as the partition 8, the Peltier effect sheet 11 itself may function for dividing the interior of the housing into the first chamber and the second chamber. In this case, the partition 8 may be omitted.

As Illustrated in FIG. 1, the Peltier effect sheet 11 of the embodiment comprises two insulating plates 6 disposed as opposed to each other, an isolating layer 7 having a thermal insulation function disposed between the two insulating plates 6, and a plurality of semiconductor element pairs sequentially disposed on a side of each insulating plate 6 that faces the isolating layer 7, first metal conductors 3 disposed apart from one another on the insulating plate 6, and second metal conductors 5 disposed apart from one another on the isolating layer 7. As an example, the isolating layer 7 is disposed on the partition 8 and the semiconductor element pairs are disposed as columns between the left insulating plate 6 and the left side of the isolating layer 7 and between the right side of the Insolating layer 7 and the right insulating plate 6, respectively. Each pair of semiconductor elements comprises a N-type semiconductor element (referred to as a N-type element thereafter) 1 and a P-type semiconductor element (referred to as a P-type element thereafter) 2. The N-type element 1 and the P-type element 2 of a semiconductor element pair are disposed apart from each other on the first metal conductor 3 and thus electrically connected to each other via the first metal conductor 3. Two semiconductor elements of the same type disposed on opposite sides of the isolating layer 7 are electrically connected in series via the second metal conductor 5.

Specifically, each N type element 1 and each P type element 2 are disposed apart from each other on a first metal conductor 3, which forms a sub-end of the Peltier effect sheet 11 (the first metal conductor 3 functions as a contact between the N type element 1 and the P type element 2). A plurality of sub-ends are disposed apart from one another on each insulating plate 6, and the N type element 1 and the P type element 2 disposed on the sub-ends on the Insulating plate 6 of the same side are in the same order, while the N type element 1 and the P type element 2 disposed on the sub-ends on the insulating plate 6 of the opposite side are in a reversed order. As an example, of each sub-end on the left insulating plate 6, the first element is an N-type element 1 and the second element is a P-type element 2. On the contrary, of each sub-end on the right insulating plate 6, the first element is a P-type element 2 and the second element is an N-type element 1. Preferably, the N-type element 1 and the P-type element 2 on the sub-ends of the right and left insulating plates 6 are arranged as mirror symmetry with each others. The second metal conductor 5 serially connects semiconductor elements of the same type disposed on the sub-ends of the Insulating plates 6 opposed to each others, such that the N-type elements 1 on opposite sides are electrically connected together. As such, the N-type elements 1 on the sub-ends of the left insulating plate 6 are electrically connected to the N-type elements 1 on the opposite sub-ends of the right insulating plate 6, the P-type elements 2 on the sub-ends of the left insulating plate 6 are electrically connected to the P-type elements 2 on the opposite sub-ends of the right insulating plate 6. By way of the above configuration, all the N-type elements 1 and the P-type elements 2 on the left and right insulating plates 6 are sequentially connected in series in a zigzag shape connection to form a chain. In some embodiments, in consideration of a symmetrical structure or other reasons, a single N-type element 1 or a P-type element 2 not forming a semiconductor element pair may be disposed at one end or both ends of the semiconductor element chain, for example, as show in FIG. 1, the N-type element 1 at the upper end (at the top-left) of the left insulating plate 6 and the P-type element 2 at the lower end (at the lower-right) of the right insulating plate 6.

A DC power source 4 drives the Peltier effect sheet 11 to work. As shown in the example of FIG. 1, the N-type element 1 at the upper end of the left insulating plate 6 is connected to the positive terminal of the DC power source 4, and the P-type element 2 at the lower end is connected to the negative terminal of the DC power source 4. In between the N-type element 1 connected to the positive terminal of the DC power source 4 and the P-type element 2 connected to the negative terminal of the DC power source 4, sub-ends with P-type elements 2 disposed above the N-type elements 1 are disposed on the left insulating plate 6, while sub-ends with N-type elements 1 disposed above the P-type elements 2 are disposed on the right insulating plate 6. In the embodiment, before being electrically connected to the Peltier effect sheet 11, the DC power source 4 may be serially connected to a variable resistor (not shown in FIG. 1), which is adapted for controlling the current flowing through the N-type elements 1 and the P-type elements 2.

When the above Peltier effect sheet 11 is working, the N-type element 1 has redundant electrons and thus has a negative temperature-difference potential; while the P-type element 2 lacks electrons and thus has a positive temperature-difference potential. Therefore, when electrons migrate from the P-type element 2 to the N-type element 1 via the contact, the temperature at the contact is decreased, and the energy accordingly increased, the increased amount being equivalent to the energy consumed by the contact. On the contrary, when electrons migrate from the N-type element 1 to the P-type element 2, the temperature at the contact will be increased. Herein, the heat at the cooling side 111 is transferred to the heating side 112, resulting in that the temperature at the cooling side 111 decreases and the temperature at the heating side 112 increases.

It is practically proved that introducing a third member different from the N-type element 1 and the P-type element 2 (such as the first metal conductor 3 and the second metal conductor 5) in the Peltier effect sheet 11 will not change the property of the Peltier effect sheet 11. The energy loss caused by the Introduction of the first metal conductor 3 and the second metal conductor 5 may be minimized by appropriately designing the structure of the Peltier effect sheet. To this end, in the embodiment, the N-type element 1 and the P-type element 2 disposed at the sub-ends on the opposed insulating plates 6 are configured as symmetrically mirroring with each other. However, it can be appreciated that this is a preferably means of the invention instead of a limitation to the invention. Those skilled in the art may flexibly design Peltier effect sheet of other structures based on practical needs.

In the embodiment, the Insulating plate 6 is an insulating ceramic plate having both excellent insulating ability and good thermal conductivity, which is beneficial to the insulation between the N-type element 1 and the P-type element 2 forming the Peltier effect sheet 11 as well as the transfer of the cooling capacity generated by the TEC to the cooling chamber 9 and the transfer of the generated heating capacity to the heating chamber 10. By using the insulating ceramic plate, the multiple sub-ends in the cooling chamber 9 and the heating chamber 10 are integrated as one, thereby acquiring the cooling capacity required by the cooling chamber 9 and the heating capacity required by the heating chamber 10. It is known from knowledge on TEC technologies that the amount of heat being absorbed and released is depended on the current flowing in the semiconductor material and the number of N-type element 1 and the P-type element 2 pairs made of the semiconductor material. In the embodiment, the number of the N-type element 1 and the P-type element 2 pairs may be determined according to the sizes of the cooling chamber 9 and the heating chamber 10 of the high and low temperature test equipment and the variation range of temperature in each chamber.

In the embodiment, as the isolating layer 7 is disposed between the cooling side 111 and the heating side 112 of the Peltier effect sheet 11, the second metal conductor 5 may electrically connect the cooling side 111 and the heating side 112 by penetrating through the isolating layer 7, thereby eliminating the heat transfer between the cooling chamber 9 and heating chamber 10 so as to ensure a better cooling efficiency for the cooling chamber and a better heating efficiency for the heating chamber 10. Preferably, the isolating layer 7 may be aluminum oxide heat isolating cotton which has good thermal isolation effect.

An air convection unit is further disposed in the heating chamber 10, so as to meet the temperature requirement and ensure the uniformity of the diffused heat in the heating chamber 10. The air convection unit comprises an inlet 13, an outlet 14 and a heat diffusing mechanism, wherein the inlet 13 is used for letting external air into the heating chamber 10, the heat diffusing mechanism is used for diffusing and circulating heat in the chamber with air, and the outlet 14 is used for exhausting air in the chamber. Air entering from the inlet 13 is heated by the heat diffusing mechanism and then increases the temperature in the chamber 10, and is eventually exhausted from the outlet 14. However, the present invention is not limited to this. The air convection unit may be disposed in each chamber, or may be suitably disposed in other manners as needed.

As illustrated in FIG. 2, the heat diffusing mechanism specifically comprises a diffusion plate 15, a fan 12 and a fan drive motor (for driving the fan 12 and not illustrated in FIG. 2). The diffusion plate 15 is made of a thermally conductive metal material and disposed on a side of the Insulating plate 6 which is opposite to the isolating layer 7 (on an end surface of the heating side 112 in the example). The fan 12 is disposed at a position opposed to the end surface of the heating side 112 and a vent direction of the fan 12 is towards the diffusion plate 15, such that the heat is diffused and circulated in the direction from the inlet 13 to the outlet 14.

The air convection unit may be classified into a single cycle mode and a dual cycle mode according to the flow direction of the heat in the heating chamber 10. In the embodiment, the single cycle mode is used. In the single cycle mode, the number of the inlet 13 may be one, an inlet valve (not shown in FIG. 2) is disposed in the inlet 13; the number of the outlet 14 may be one, an outlet valve (not shown in FIG. 2) is disposed in the outlet 14. The Inlet 13 and the corresponding inlet valve are disposed on a different side wall of the heating chamber 10 from the outlet 14 and the corresponding outlet valve.

In short, to implement the single cycle mode of the embodiment, the thermal conducting metal diffusion plate 15 is connected to the heating side 112, and air enters from the inlet 13 and is heated when flowing through the thermal conducting diffusion plate 15 connected to the heating side 112. Heated air is blown into the heating chamber 10 by the fan 12 and eventually exhausted from the outlet 14. By way of the air convection unit, the heat generated by the heating side 112 may be rapidly diffused in the heating chamber 10, which on one hand causes the heating chamber 10 to be heated rapidly, and on the other hand guarantees the cooling effect in the cooling side 11.

As the external air of the chamber is introduced as a heat transfer medium, a filter unit is disposed in front of the heat diffusing unit which blows the air into the heating chamber 10 via the inlet 13 so as to guarantee the clearness in the heating chamber 10. The filter unit comprises a filter grid 16 and a grating plate 17. The grating plate 17 is disposed parallel to and separated from the partition 8. The fan 12 is disposed on a side of the grating plate 17 that faces the partition 8, and the filter grid 16 and the grating plate 17 are disposed adjacent to each other. The grating plate 17 may comprise sub grating plates (not shown in the figure) arranged in an intersecting manner vertically and horizontally, wherein the grating plate 17 may be completely or partially made of the sub grating plates. An opening control valve for adjusting the opening of the sub grating plate is disposed in the sub grating plate. By adjusting the opening control valve, the grating plate 17 may form a plate-like grating plate without any space in between (when the opening control valve is fully closed), or form a grating plate with several gratings having adjustable spaces in between (when the opening control valve is not fully closed). The filter grid 16 comprises a plurality of grids arranged in the latitudinal and longitudinal directions with a certain interval therebetween. The grating plate 17 together with the filter grid 16 may adjust the amount of air entering the heating chamber 10 from the exterior, and effectively blocking impurities in the external air from entering the heating chamber 10.

A plurality of notches 18 for holding plate-like components are arranged in both the cooling chamber 9 and the heating chamber 10. In the embodiment, the notches 18 are mainly used for holding liquid crystal panels 19, such that multiple liquid crystal panels 19 may be cooled or heated at the same time. Preferably, the filter grid 16 and the grating plate 17 are disposed between the notches 18 and the heat diffusing mechanism.

To realize automation, the high and low temperature test equipment further comprises a control unit and a temperature acquiring unit; the temperature acquiring unit comprises a first temperature acquiring unit and a second temperature acquiring unit; the Peltier effect sheet is serially connected to a variable resistor, and the control unit is electrically connected to the first temperature acquiring unit, the second temperature acquiring unit and the variable resistor respectively, wherein:

the first temperature acquiring unit is disposed in at least one chamber and adapted for acquiring a first temperature value in this chamber in real time, and outputs the acquired first temperature value to the control unit;

the second temperature acquiring unit is disposed on the Peltier effect sheet and adapted for acquiring a second temperature value of one end of the Peltier effect sheet which is located in this chamber in real time, and outputs the acquired second temperature value to the control unit;

the control unit determines whether the first temperature value is equal to a preset temperature value of the chamber and adjusts the resistance of the variable resistor according to the determination result to control a current so as to control the temperature value of the one end of the chamber where the Peltier effect sheet is disposed, so that the temperature in the heating chamber is adjusted.

Preferably, the control unit may further comprises a determining sub module for determining whether the first temperature value is equal to a preset temperature value of the chamber and a processing sub module for adjusting the resistance of the variable resistor according to the determination result to control a current so as to control the second temperature value.

The control unit may also control the components of the air convection unit according to the determination result, such as the opening of the Inlet valve of the inlet 13, the opening of the outlet valve of the outlet 14, the opening of the opening control valve of the sub grating plate, the venting amount and the venting speed of the fan 12, thereby adjusting the temperature in the heating chamber.

In the embodiment, the control unit is a Programmable Logic Controller (PLC), the first and second temperature acquiring units are each a temperature sensor. Specifically, in the embodiment, the cooling temperature in the cooling chamber 9 is sensed by a first temperature sensor in the first temperature acquiring unit and recorded as a temperature value a; the heating temperature in the heating chamber 10 is sensed by a second sensor in the first temperature acquiring unit and recorded as a temperature value b; the temperature at the cooling side 111 of the Peltier effect TEC is sensed by a third sensor in the second temperature acquiring unit and recorded as a temperature value c; the temperature at the heating side 112 of the Peltier effect TEC is sensed by a fourth sensor in the second temperature acquiring unit and recorded as a temperature value d. The temperature values a, b, c and d are all sent to the PLC, which controls the actions of the variable resistor and the air convection unit, such that the temperature precision and the temperature increasing/decreasing speed in the cooling chamber 9 and the heating chamber 10 of the high and low temperature test equipment are precisely controlled, thereby realizing a power-saving and efficient high and low temperature test equipment.

Figure 5:
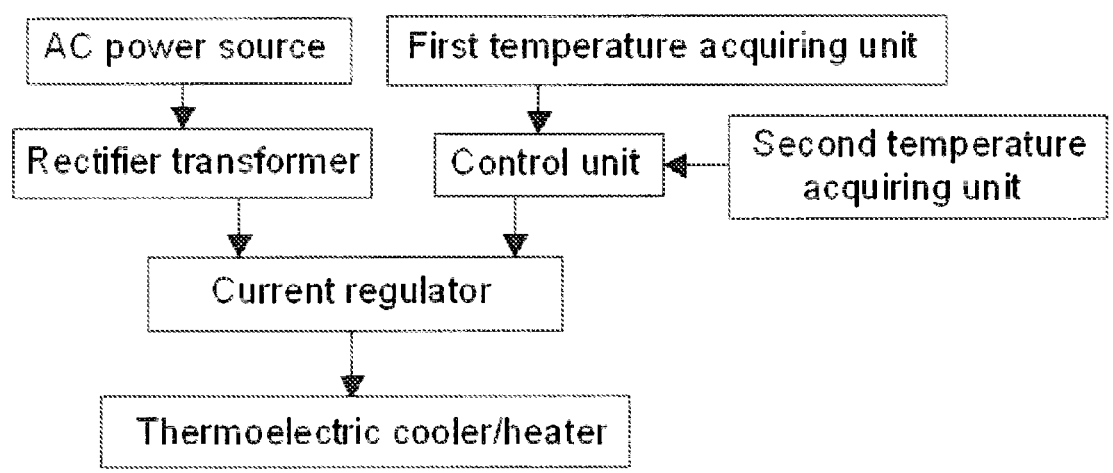
FIG. 5 is a schematic configuration of a temperature control unit in a cooling chamber of FIG. 2.

In the high and low temperature test equipment, the variable resistor is powered by the DC power supply 4. In the case of keeping other conditions invariable, the heat absorbing or releasing efficiency of the Peltier effect sheet 11 is proportional to the DC current I flowing in the variable resistor. Therefore, the heating or cooling capacity of the Peltier effect sheet 11 may be conveniently adjusted by adjusting the DC power source 4 powering the variable resistor. As illustrated in FIG. 5, the DC power source 4 in the embodiment is adjusted in the following way: an AC power is turned into a DC power 4 via a rectifier transformer; a current regulator outputs a current required by the Peltier effect sheet 11 according to the determination result of the control unit, such that the cooling capacity required in the cooling chamber 9 is eventually achieved.

Figure 6:
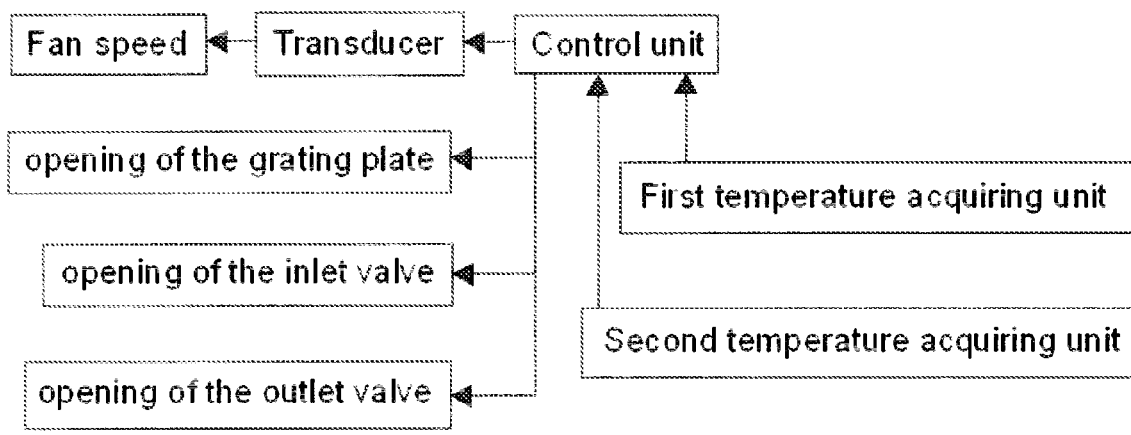
FIG. 6 is a schematic configuration of a temperature control unit in a heating chamber of FIG. 2.

As illustrated in FIG. 6, the function of the air convection unit in the heating chamber 10 includes adjusting at least one of the following factors: the venting amount and venting speed of the fan 12, the opening of the grating plate 17, the opening of the inlet valve, the opening of the outlet valve and the like. Specifically, when the temperature value b of the heating chamber 10 is lower than the preset temperature value and the temperature value d is higher than the temperature value b, the air convection unit in the heating chamber 10 is controlled to perform one or more of the following adjustment: increasing the venting speed of the fan 12, increasing the opening of the grating plate 17, increasing the opening of the Inlet valve and decreasing the opening of the outlet valve. On the contrary, when the temperature value b of the heating chamber 10 is higher than the preset temperature value, the air convection unit in the heating chamber 10 is controlled to perform one or more of the following adjustment decreasing the venting speed of the fan 12, decreasing the opening of the grating plate 17, decreasing the opening of the inlet valve and increasing the opening of the outlet valve. Herein, the venting speed of the fan 12 is controlled by the frequency of the motor driving the fan 12. Meanwhile, a plurality of parameters such as the openings of the inlet valve and the outlet valve, the opening of the grating plate 17 and the venting speed of the fan 12 (or the frequency of the motor driving the fan 12) have to be monitored, which is well known to those skilled in the art and will not be elaborated here.

Generally, when performing the high and low temperature test on the liquid crystal panel, the cooling temperature of the cooling chamber 9 should be within the range of 0° C.~−20° C., the heating temperature of the heating chamber 10 should be within the range of 80° C.~100° C. In the high and low temperature test equipment of the embodiment, the Peltier effect sheet 11 having the Peltier effect may keep the cooling temperature of the cooling chamber 9 to the range of 0° C.~−25° C. and rapidly diffuse the heat in combination with the air convection unit in the heating chamber 10, thereby keeping the temperature of the heating chamber 10 to a range of 80° C.~100° C. Meanwhile, it may prevent overheating of the Peltier effect sheet 11. It can be seen that the high and low temperature requirements needed by the high and low temperature test may be met by using the Peltier effect sheet 11 having the Peltier effect. Moreover, the high and low temperature requirements are within the functional range of the Peltier effect sheet 11.

The high and low temperature test equipment in accordance with the embodiment has the following advantages: first, the equipment is compact, which saves the clean room space as well as the labor for transferring and moving of the liquid crystal panels; and second, no cooling agent is required, which eliminates the noise pollution and the cooling agent pollution.

Embodiment 2

The embodiment differs from Embodiment 1 in that the high and low temperature test equipment does not comprise the first and second temperature acquiring units. That is, the embodiment does not comprise the first to the fourth temperature sensors.

In the embodiment, the temperatures in the cooling chamber 9 and the heating chamber 10 may be acquired by manually measuring via a thermometer. Alternatively, a thermometer may be placed in the cooling chamber 9 or the heating chamber 10 in advance and then read by a person to obtain the temperatures.

The other components in the high and low temperature test equipment of the embodiment are the same as those in Embodiment 1 and will not be elaborated here. In addition to the advantages of Embodiment 1, the high and low temperature test equipment according to the embodiment may further reduce the structural complexity and volume of the equipment as well as the manufacture cost.

Embodiment 3

The embodiment differs from Embodiment 1 in that the air convection unit in the heating chamber 10 of the high and low temperature test equipment employs a dual cycle mode. In comparison with the single cycle mode of Embodiment 1, the dual cycle mode of the embodiment may guarantee a more uniform heat distribution in the heating chamber 10, more stable temperature and more accurate result of the high temperature test.

Figure 3:
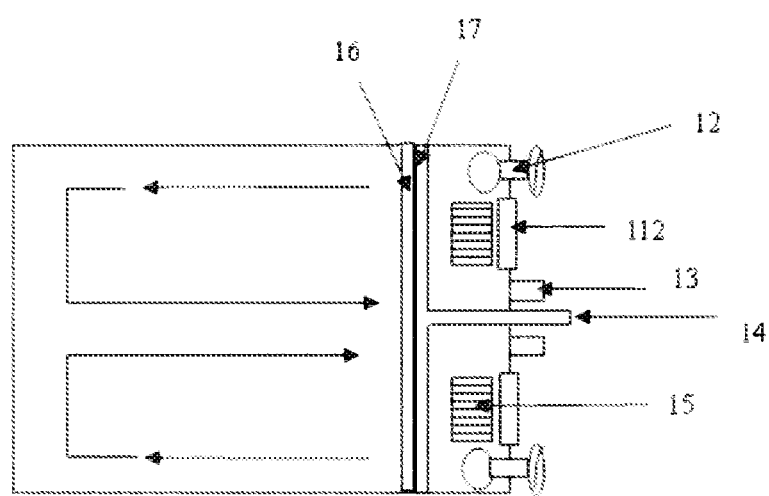
FIG. 3 is a schematic diagram showing a dual-cycle method of an air convection unit in a heating chamber of Embodiment 3 of the invention.

As Illustrate in FIG. 3, in the dual cycle heating chamber 10, there are two inlets 13 with Inlet valves (not shown in FIG. 3) accordingly disposed therein, while only one outlet 14 is needed, which also has an outlet valve (not shown in FIG. 3) disposed therein. The two inlets 13 and the corresponding inlet valves, the outlet 14 and the corresponding outlet valve are disposed on the same side wall of the heating chamber 10. Preferably, the two inlets 13 are disposed on both sides of the outlet 14 respectively. In this way, air carrying the heat and blown in by the fan 12 enters the heating chamber 10 as two streams, and is circulated in the heating chamber 10, and then exhausted from the heating chamber 10 via the outlet 14.

In the embodiment, the Peltier effect sheet 11 is partitioned into two parts which are disposed at the upper and lower portions of the partition 8, that is, on both sides of the outlet 14.

The other components in the high and low temperature test equipment of the embodiment are the same as those in Embodiment 1 and will not be elaborated here. In addition to the advantages of Embodiment 1, the high and low temperature test equipment according to the embodiment has the following advantages: it is efficient, energy conserving and has small inertia; it is quick in heating and cooling; it may achieve maximum temperature difference quickly when heating in the heating side works well and the cooling side has no load. Moreover, the uniformity of the heat in the heating chamber is high, the temperature is more stable, and the result of the high temperature test is more accurate.

Embodiment 4

The embodiment differs from Embodiment 3 in that the high and low temperature test equipment does not comprise the first and second temperature acquiring units. That is, the embodiment does not comprise the first to the fourth temperature sensors.

In the embodiment, the temperatures in the cooling chamber 9 and the heating chamber 10 may be acquired by manually measuring via a thermometer. Alternatively, a thermometer may be placed in the cooling chamber 9 or the heating chamber 10 in advance and then read by a person to obtain the temperatures.

The other components in the high and low temperature test equipment of the embodiment are the same as those in Embodiment 3 and will not be elaborated here. In addition to the advantages of Embodiment 1, the high and low temperature test equipment according to the embodiment further has the advantages of Embodiments 2 and 3.

Embodiment 5

The embodiment differs from Embodiments 1 and 3 in that the separate first and second chambers in the high and low temperature test equipment each has the cooling and heating function at the same time. That is, the first chamber cools, the second chamber heats (the same as Embodiments 1 and 3), or vice versa. In according to the principle of the Peltier effect, when the direction of DC current flowing in the Peltier effect sheet is reversed, releasing/absorbing heat at the contact (that is, the first metal conductor of the sub-end in the embodiment) is reversible, which means the heat-absorbing and heat-releasing at the contact are exchanged accordingly. Therefore, individual chambers may be cooled or heated by reversing the current direction of the Peltier effect sheet. Furthermore, the amount of heat being absorbed or released is proportional to the DC current I flowing in the circuit. Therefore, the temperature change speed in the chambers may be controlled by adjusting the current I in the circuit.

In the embodiment, on the left insulating plate 6, when current flows from the P-type element 2 to the N-type element 1, the contact (that is, the first metal conductor 3) becomes the heating sub-end, the plurality of heating sub-ends on the left insulating plate 6 therefore become heating side 112. As the heating side 112 is disposed in the left chamber, heat is thus provided to the left chamber so as to make the left chamber heated, and the left chamber is the heating chamber 10. Accordingly, on the right insulating plate 6, when current flows from the N-type element 1 to the P-type element 2, the contact (that is, the first metal conductor 3) becomes the cooling sub-end, the plurality of cooling sub-ends on the right insulating plate 6 therefore become the cooling side 111. As the cooling side 111 is disposed in the right chamber, heat is thus absorbed from the right chamber so as to make the right chamber cooled, and the right chamber is the cooling chamber 9. When the DC current in the Peltier effect sheet is reversed, the left chamber becomes the cooling chamber and the right chamber becomes the heating chamber.

Figure 4:
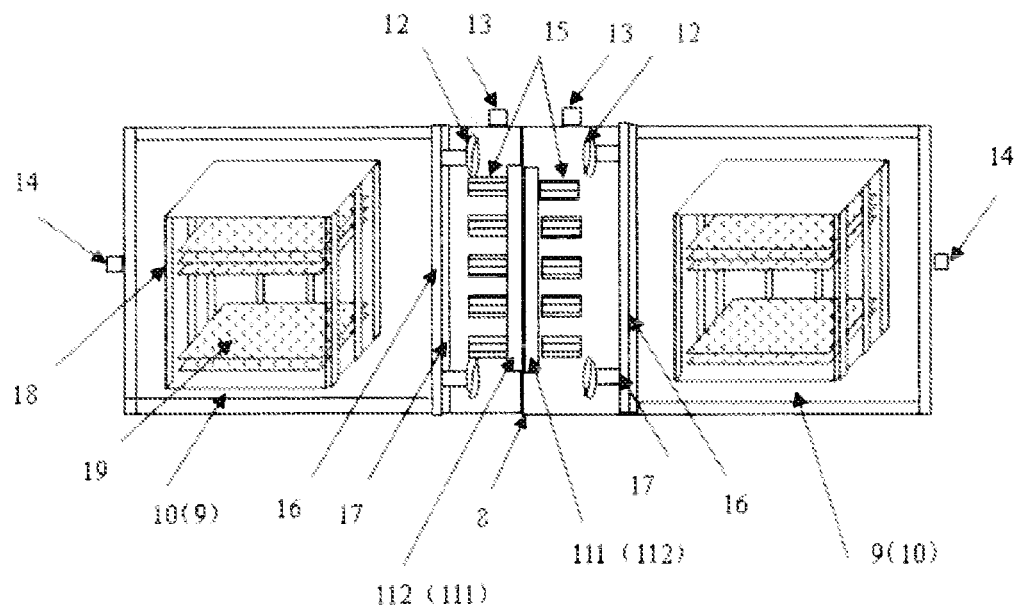
FIG. 4 is a schematic configuration of a high and low temperature test equipment in accordance with Embodiment 5 of the present invention.

Accordingly, in the embodiment, the single cycle air convection unit (as shown in FIG. 4) as that in Embodiment 1 or the dual cycle air convection unit (as shown in FIG. 2 or 3) as that in Embodiment 3 is disposed in both the first chamber and the second chamber. Moreover, when one of the two chambers is the cooling chamber, the other is the heating chamber. By this means, it may effectively improve the efficiency of the high temperature test. However, in this case it needs to balance the time of the low and high temperature performing on the liquid crystal panels at the same time, such that the energy of the heating side and the cooling side of the Peltier effect sheet may be effectively used.

The other components in the high and low temperature test equipment of the embodiment are the same as those in Embodiment 1 or 3 and will not be elaborated here. Base on the above Embodiments 1 and 3, the high and low temperature test equipment of the embodiment may further adjust the heating and cooling capacity of the Peltier effect sheet by adjusting the current. Therefore, in addition to the advantages of Embodiments 1 and 3, the high and low temperature test equipment of the embodiment further has the advantages of reliable, long lifetime, easily controllable and adjusted.

Embodiment 6

The embodiment is a variation of Embodiment 5 and has the following modification: the high and low temperature test equipment does not comprise the first and second temperature acquiring units. That is, the embodiment does not comprise the first to the fourth temperature sensors.

In the embodiment, the temperatures in the cooling chamber 9 and the heating chamber 10 may be acquired by manually measuring via a thermometer. Alternatively, a thermometer may be placed in the cooling chamber 9 or the heating chamber 10 in advance and then read by a person to obtain the temperatures.

The other components in the high and low temperature test equipment of the embodiment are the same as those in Embodiment 5 and will not be elaborated here. In addition to the advantages of Embodiment 1, the high and low temperature test equipment according to the embodiment further has the advantages of Embodiments 1 to 4.

The high and low temperature test equipment according to the invention is especially suitable for applications of the high and low temperature test on the liquid crystal panels and the limitation of LC margin in the pre-test of panels in the technical field of LCD fabrication. As the dean room is generally an environment with constant temperature and humidity, the capability of the heating and cooling at the same time by the Peltier effect sheet is employed to apply its cooling capacity to the cooling chamber to perform low temperature test on the LC panels, and to supply its heating capacity to the heating chamber via the air convection unit to perform high temperature test on the LC panels. Therefore, there is no temperature exchange between the high and low temperature test equipment and the environment in which it is located, thereby helping to meet the requirement of constant temperature and humidity in the clean room.

It can be understood that the above embodiments are for illustrating the principle of the invention only and not limitative to the invention. For example, the number of the chambers is not limited to two. Each component and feature of the embodiments may be combined in the case of not conflicting with each other. Various modifications and variations can be made by the person skilled in the art without departing from the spirit and scope of the present invention. As such, if these modifications and variations of the present invention come within the scope of the claims and their equivalents, it is intended that the present invention cover such modifications and variations.

What is claimed is:

1. A high and low temperature test equipment comprising a housing, characterized in that the equipment further comprises a partition disposed in the interior of the housing, the partition dividing the interior of the housing into a plurality of chambers, and the partition being provided with a Peltier effect sheet which is used for, when it is powered-on, cooling at least one of the chambers and meanwhile heating at least one chamber other than the at least one of the chambers.

2. The equipment of claim 1, wherein the chambers are cooled or heated based on a current flow direction in the Peltier effect sheet.

3. The equipment of claim 1, wherein a plurality of notches for holding plate-like components are disposed in at least one of the chambers.

4. The equipment of claim 1, further comprises a control unit and a temperature acquiring unit, the temperature acquiring unit comprises a first temperature acquiring unit and a second temperature acquiring unit, the Peltier effect sheet is serially connected to a variable resistor, and the control unit is electrically connected to the first temperature acquiring unit, the second temperature acquiring unit and the variable resistor respectively, wherein, the first temperature acquiring unit is disposed in at least one chamber and adapted for acquiring a first temperature value in the chamber in real time, and outputting the acquired first temperature value to the unit;

the second temperature acquiring unit is disposed on the Peltier effect sheet and adapted for acquiring a second temperature value of one end of the Peltier effect sheet which is in the chamber in real time, and outputting the acquired second temperature value to the control unit; and the control unit determines whether the first temperature value is equal to a preset temperature value of the chamber and adjusts a resistance of the variable resistor according to the determination result to control a current so as to control the second temperature value.

5. The equipment of claim 4, wherein the control unit comprises a determining sub module for determining whether the first temperature value is equal to the preset temperature value of the chamber and a processing sub module for adjusting the resistance of the variable resistor according to the determination result to control the current so as to control the second temperature value.

6. The equipment of claim 1, wherein an air convection unit is disposed in each of the chambers.

7. The equipment of claim 6, wherein a plurality of notches for holding plate-like components are disposed in at least one of the chambers.

8. The equipment of claim 6, wherein the air convection unit comprises an inlet, an outlet and a heat diffusing mechanism, wherein the inlet is used for accessing of external air into the chamber, the outlet is used for air exhausting from the chamber, and the heat diffusing mechanism is used for diffusing and circulating heat in the chamber through the air.

9. The equipment of claim 8, wherein a plurality of notches for holding plate-like components are disposed in at least one of the chambers.

10. The equipment of claim 1, wherein an air convection unit is disposed in chamber being heated.

11. The equipment of claim 10, wherein a plurality of notches for holding plate-like components are disposed in at least one of the chambers.

12. The equipment of claim 10, wherein the air convection unit comprises an inlet, an outlet and a heat diffusing mechanism, wherein the inlet is used for accessing of external air into the chamber, the outlet is used for air exhausting from the chamber, and the heat diffusing mechanism is used for diffusing and circulating heat in the chamber through the air.

13. The equipment of claim 12, wherein a plurality of notches for holding plate-like components are disposed in at least one of the chambers.

14. The equipment of the claim 12, wherein the inlet and the outlet are respectively disposed on a wall of the chamber, and the heat diffusing mechanism comprises a diffusion plate and a fan, the diffusion plate being disposed on a side of the partition and the vent direction of the fan being towards the diffusion plate.

15. The equipment of claim 14, wherein a plurality of notches for holding plate-like components are disposed in at least one of the chambers.

16. The equipment of claim 14, wherein a grating plate parallel to and separated from the partition is further disposed in the chamber being heated, and the fan is disposed on a side of the grating plate that faces the partition; and the inlet is disposed on a chamber wall next to the partition and is positioned between the grating plate in the chamber being heated and the partition, and the outlet is disposed on a chamber wall opposite to the grating plate;

or, both the inlet and the outlet are disposed on the partition and connected to a pipe leading to the exterior of the housing, with one outlet being disposed between two inlets.

17. The equipment of claim 16, wherein a filter grid is disposed in the chamber being heated, the filter grid being adjacent to the grating plate.

18. The equipment of claim 16, wherein a plurality of notches for holding plate-like components are disposed in at least one of the chambers.

19. The equipment of claim 16, wherein at least a part of the grating plate consists of sub grating plates arranged in an intersecting manner vertically and horizontally, the sub grating plate being provided with an opening control valve for adjusting opening of the sub grating plate, and wherein the inlet is provided with an inlet valve and the outlet is provided with an outlet valve.

20. The equipment of claim 19, wherein a plurality of notches for holding plate-like components are disposed in at least one of the chambers.

* * * * *